(12) United States Patent
Chang et al.

(10) Patent No.: US 9,373,409 B2
(45) Date of Patent: Jun. 21, 2016

(54) SYSTEMS AND METHODS FOR REDUCED PROGRAM DISTURB FOR 3D NAND FLASH

(71) Applicant: MACRONIX INTERNATIONAL CO., LTD., Hsinchu (TW)

(72) Inventors: Kuo-Pin Chang, Miaoli County (TW); Chih-Shen Chang, New Taipei (TW)

(73) Assignee: MACRONIX INTERNATIONAL CO., LTD. (TW)

( * ) Notice: Subject to any disclaimer, the term of this patent is extended or adjusted under 35 U.S.C. 154(b) by 72 days.

(21) Appl. No.: 14/326,212

(22) Filed: Jul. 8, 2014

(65) Prior Publication Data

US 2016/0012905 A1 Jan. 14, 2016

(51) Int. Cl.
G11C 16/34 (2006.01)
G11C 11/56 (2006.01)
G11C 16/04 (2006.01)

(52) U.S. Cl.
CPC ........ G11C 16/3427 (2013.01); G11C 11/5628 (2013.01); G11C 16/0483 (2013.01); G11C 2211/5622 (2013.01); G11C 2211/5648 (2013.01)

(58) Field of Classification Search
CPC .................. G11C 16/3427; G11C 11/5628
USPC ......................................................... 365/185.2
See application file for complete search history.

(56) References Cited

U.S. PATENT DOCUMENTS

| 6,034,882 | A | 3/2000 | Johnson et al. |
| 6,906,940 | B1 | 6/2005 | Lue |
| 7,081,377 | B2 | 7/2006 | Cleeves |
| 7,129,538 | B2 | 10/2006 | Lee et al. |
| 7,177,169 | B2 | 2/2007 | Scheuerlein |
| 7,459,715 | B2 | 12/2008 | Toda et al. |
| 7,995,371 | B2 | 8/2011 | Rinerson et al. |
| 8,503,213 | B2 | 8/2013 | Chen et al. |
| 2005/0280061 | A1 | 12/2005 | Lee |
| 2007/0134855 | A1 | 6/2007 | Lai et al. |
| 2008/0101109 | A1 | 5/2008 | Haring-Bolivar et al. |
| 2009/0097321 | A1 | 4/2009 | Kim et al. |
| 2009/0184360 | A1 | 7/2009 | Jin et al. |
| 2009/0230449 | A1 | 9/2009 | Sakaguchi et al. |
| 2009/0278193 | A1* | 11/2009 | Murata ............ H01L 27/11551 257/324 |
| 2010/0226195 | A1* | 9/2010 | Lue ..................... H01L 27/0688 365/230.06 |
| 2010/0270593 | A1 | 10/2010 | Lung et al. |
| 2010/0315875 | A1 | 12/2010 | Kim et al. |
| 2010/0322000 | A1 | 12/2010 | Shim et al. |
| 2011/0216604 | A1 | 9/2011 | Mikajiri et al. |
| 2012/0182802 | A1* | 7/2012 | Hung ................. G11C 13/0002 365/185.11 |
| 2012/0182806 | A1* | 7/2012 | Chen ................. H01L 27/11573 365/185.17 |

FOREIGN PATENT DOCUMENTS

| EP | 1936681 A1 | 6/2008 |
| EP | 2048709 A2 | 4/2009 |

* cited by examiner

Primary Examiner — Huan Hoang
Assistant Examiner — Muna A Techane
(74) Attorney, Agent, or Firm — Baker & McKenzie LLP

(57) ABSTRACT

Common problems when programming 3D NAND Flash memory having alternating page orientation include the back-pattern effect and pattern-induced program disturb. Improved programming techniques may substantially reduce these problems and, in turn, increase precision when setting memory cells' threshold voltages. Provided are exemplary techniques that combine aspects of "by-word-line" programming and "by-page" programming. As such, each page may be programmed beginning with the memory cells that are closest to string select structures, and memory cells on multiple even or odd pages may be programmed substantially simultaneously.

16 Claims, 6 Drawing Sheets

SYSTEMS AND METHODS FOR REDUCED PROGRAM DISTURB FOR 3D NAND FLASH

RELATED APPLICATIONS

The present application is related to U.S. patent application Ser. No. 13/078,311 entitled "Memory Architecture of 3D Array with Alternating Memory String Orientation and String Select Structures," filed Apr. 1, 2011 and issued as U.S. Pat. No. 8,503,213 on Aug. 6, 2013, the contents of which are incorporated herein by reference.

BACKGROUND

1. Technical Field

The present application generally relates to three-dimensional NAND Flash memory and, more specifically, to systems and methods of programming memory cells in an array to reduce the influence of program disturb and back-pattern effects.

2. Related Art

NAND Flash memory is a nonvolatile memory that is used in a wide range of applications including mobile phones, digital cameras, and solid-state hard drives. The high storage density of NAND Flash memory, especially when compared to NOR Flash memory, has played a large role in its market penetration. This storage density is achieved in part through the use of strings of memory cells connected in series between a ground line and bit lines, which reduces the number of metal contacts required. These strings are commonly called "NAND strings" due to their resemblance to NAND gates. Each memory cell within a NAND string can be addressed by a word line that the memory cell shares with neighboring cells of other NAND strings. In the past, NAND Flash memory has been implemented as a two-dimensional (planar) array defined by word lines and bit lines that intersect perpendicularly, with the memory cells being formed at those intersections.

The NAND string topology has been further developed to achieve still greater storage density. Such efforts have lead to the development of three-dimensional (3D) NAND Flash memory, in which memory cells are stacked vertically on top of one another.

FIG. 1 shows a schematic diagram illustrating a prior 3D NAND Flash array, as well as various transistors used for control. This figure shows four pages 150, 151, 152, 153 (Page 0 to Page 3), which contain a total of eight NAND strings 110. Each NAND string 110 includes a plurality of memory cells, such as the memory cell 112. Each memory cell can be addressed using at least one of the bit lines 140, 141 ($BL_0$ and $BL_1$), at least one of the string select lines 130, 131, 132, 133 ($SSL_0$ to $SSL_3$), and at least one of the word lines 120, 121, 120n ($WL_0$ to $WL_n$). The bit lines 140, 141 may connect to the memory planes 190, 191 defined in different depths of the array structure, such that the memory planes associated with different bit lines may be stacked on top of one another in a z-direction 184. In the embodiment shown in FIG. 1, the bit line 140 ($BL_0$) accesses the plane 190 (Plane 0) and the bit line 141 ($BL_1$) accesses the plane 191 (Plane 1), which is above the plane 190. Furthermore, the bit lines 140, 141 may each be provided at opposite sides of the array structure.

String select lines 130, 131, 132, 133 may be connected to string select transistors 135, which are formed in string select structures on opposite sides of the array structure. These string select transistors connect the array structure to on-chip sense circuitry (not shown) attached to each bit line 140, 141. Each page may be associated with a unique string select line. As shown in the figure, the page 150 (Page 0) is addressed by the string select line 130, the page 151 (Page 1) is addressed by the string select line 131, the page 152 (Page 2) is addressed by the string select line 132, and the page 153 (Page 3) is addressed by the string select line 133. This allows an SSL signal travelling on a given string select line to select a given page (e.g., a stack) of memory cells, effectively setting an "x" coordinate in an x-direction 180. It should be further noted that each page may comprise multiple NAND strings 110, and each NAND string 110 may have an associated string select transistor 135.

The string select transistors 135 connected to even pages 150, 152 may form a first string select structure on one side of the array, and the string select transistors 135 connected to odd pages 151, 153 may form a second string select structure on the opposite side of the array.

The word lines 120, 121, 120n may be connected to gates of the memory cells. Accordingly, a WL signal may address a given memory cell within a selected NAND string, thereby setting a "y" coordinate in a y-direction 182.

Accordingly, each cell within the 3D NAND Flash array may effectively be addressable through "x," "y," and "z" coordinates. More specifically, the cells are addressable through signals on the control lines, and they may be addressed for read, program, and erase operations thereby. For example, the memory cell 112 may be addressed by sending and/or receiving signals on the string select line 133, the word line 120n, and the bit line 140. Control signals on unselected lines may additionally be required to perform a given operation.

Ground select lines 160, 161 (GSL(even) and GSL(odd)) may be used to connect and disconnect even and odd pages from common source lines 170, 171 (CSL). In some embodiments, common source lines 170 and 171 are connected together.

It should be noted that the orientations of strings in adjacent pages alternate between bit-line-end-to-source-line-end and source-line-end-to-bit-line-end, which results in the positions of the string select structure (which connects the array to the bit lines) and the common source line physically alternating between even pages and odd pages. For example, on even pages 150, 152, the word line 120 ($WL_0$) is the nearest word line to the common source line 170. However, on odd pages 151, 153, the same word line 120 is the farthest from the common source line 171. Related U.S. Pat. No. 8,503,213 provides further detail into this topology, as well as the reasoning behind it, and is incorporated herein by reference for these and all other purposes. This structure results in a few notable features and consequences.

As indicated by the dashed lines in FIG. 1, the number of word lines may vary based on design considerations. While FIG. 1 shows four pages and two bit lines, the number of pages and bit lines may also vary based on design considerations.

While 3D NAND Flash provides numerous benefits, such as allowing for greater scalability in memory density, it provides new challenges as well. For example, the conventional programming techniques generally applied to 2D NAND Flash arrays may not be as effective when directly applied to 3D NAND Flash arrays. These 2D techniques involve sequentially programming the memory cells, for example, starting with the cell nearest the common source line and finishing with the cell nearest the string select line. This is typically achieved by programming all cells associated with a given word line (e.g., a complete row spanning multiple pages) simultaneously. Accordingly, each row is iterated through until the final row (e.g., the row nearest the string select line) is reached and programmed.

However, employing a similar strategy with the above-described 3D NAND Flash array yields numerous problems, such as read verification issues due to the back-pattern effect in half of the pages. Further issues of program disturb may occur as well.

To understand why these issues occur, it is helpful to understand the physical mechanisms behind information storage. The "memory" of memory cells is often provided through their having an adjustable threshold voltage ($V_t$). A memory controller may set the $V_t$ of a given cell through program operations and erase operations, and the controller may evaluate the $V_t$ of the cell through a read operation.

In the context of single-level cell (SLC) NAND Flash memory, a programming operation may increase a cell's $V_t$ value above a predetermined boundary value, which allows the cell to store a digital value of "0." Similarly, an erase operation may decrease the cell's $V_t$ value below the boundary value, which allows the cell to store a digital value of "1." During a subsequent read operation, the $V_t$ value may be compared to the boundary value, which would allow the stored digital value to be determined as either a "0" or a "1."

Multi-level cell (MLC) NAND Flash memory expands upon these principles to provide more than one bit in each cell. This is accomplished by utilizing more than one boundary value. For example, three boundary values may be chosen, and $V_t$ may be compared to these boundary values. This effectively provides for four different scenarios, which may represent the digital values of "00," "01," "10," and "11." Thus, two bits may be stored in each cell. The number of boundary values can be further increased to enable additional bits to be stored in each cell.

As mentioned above, issues can arise when 2D NAND Flash programming techniques are directly applied to 3D NAND Flash arrays. For example, the programmed and erased $V_t$ values may be systematically disturbed. Accordingly, the threshold voltage ($V_t$) distributions within the memory cells representing a given bit or bits can be widened. When these $V_t$ distributions widen, $V_t$ readings for adjacent bits begin to overlap more frequently, and discerning the stored digital values becomes more challenging. This is especially important in MLC NAND Flash, where the allowable $V_t$ margins between adjacent bits are generally less than those of SLC NAND Flash. Once the number of incorrect readings exceeds a system's tolerance, which is provided in part by error correcting code (ECC), a memory block may fail. It is therefore highly desirable to tighten the $V_t$ distributions of the programmed memory cells to improve reliability and performance, while also increasing the associated process window.

SUMMARY

Disclosed herein are systems and methods for programming memory cells. The memory cells may be part of an array structure organized into a plurality of even pages, a plurality of odd pages, and a plurality of rows that are perpendicular to the even and odd pages. Each row may be associated with a word line and may include a first plurality of memory cells that are located on the even pages and a second plurality of memory cells that are located on the odd pages.

The even pages may be connected to a first string select structure located at a first side of the array structure. The first string select structure may select the even pages in order to program the memory cells within these pages. Similarly, the odd pages may be connected to a second string select structure located at a second side of the array structure opposite the first side. The second string select structure may select the odd pages in order to program the memory cells within these pages.

The array structure and string select structures may be operably connected to a controller, which may program the memory cells within the pages. The controller may program the even pages by beginning with the memory cells closest to the first string select structure. The controller may implement a similar strategy to program the odd pages by beginning with the memory cells closest to the second string select structure.

In some embodiments, the controller may program the memory cells in the even pages before the memory cells in the odd pages are first programmed. In other embodiments, the controller may program the memory cells in the odd pages before the memory cells in the even pages are first programmed. In yet other embodiments, the controller may program even and odd rows of memory cells alternately, and still starting with the memory cells closest to the related string select structure that accesses those memory cells.

In some embodiments, each memory cell in the first plurality of memory cells may be individually programmed, such that when a memory cell within the first plurality of memory cells is programmed, programming is inhibited for a remainder of memory cells within the first plurality of memory cells. Similarly, each memory cell in the second plurality of memory cells may be individually programmed.

In some embodiments, all of the memory cells within even pages that are in the first row may be programmed substantially simultaneously with one another during a first time period. Programming may be inhibited on the odd pages during this time. Similarly, all of the memory cells within the odd pages that are in the last row may be programmed substantially simultaneously with one another during a second time period. Programming may be inhibited on the even pages during this time.

In some embodiments, the array structure may be a 3D NAND Flash array structure. In some embodiments, the memory cells within the array structure may be multi-level cells that each store more than one bit of information. The memory cells may alternatively be single-level cells that each store one bit of information.

BRIEF DESCRIPTION OF THE DRAWINGS

Features, aspects, and embodiments of the inventions are described in conjunction with the attached drawings, in which.

These exemplary figures and embodiments, along with the exemplary figures that are included in the body of this patent application, are to provide a written, detailed description of the subject matter set forth by any claims that issue from the present application. These exemplary figures and embodiments should not be used to limit any claims that ultimately issue in a patent from the present application.

Further, although similar reference numbers may be used to refer to similar structures for convenience, it can be appreciated that each of the various example embodiments may be considered to be distinct variations.

DETAILED DESCRIPTION

Figure 1:
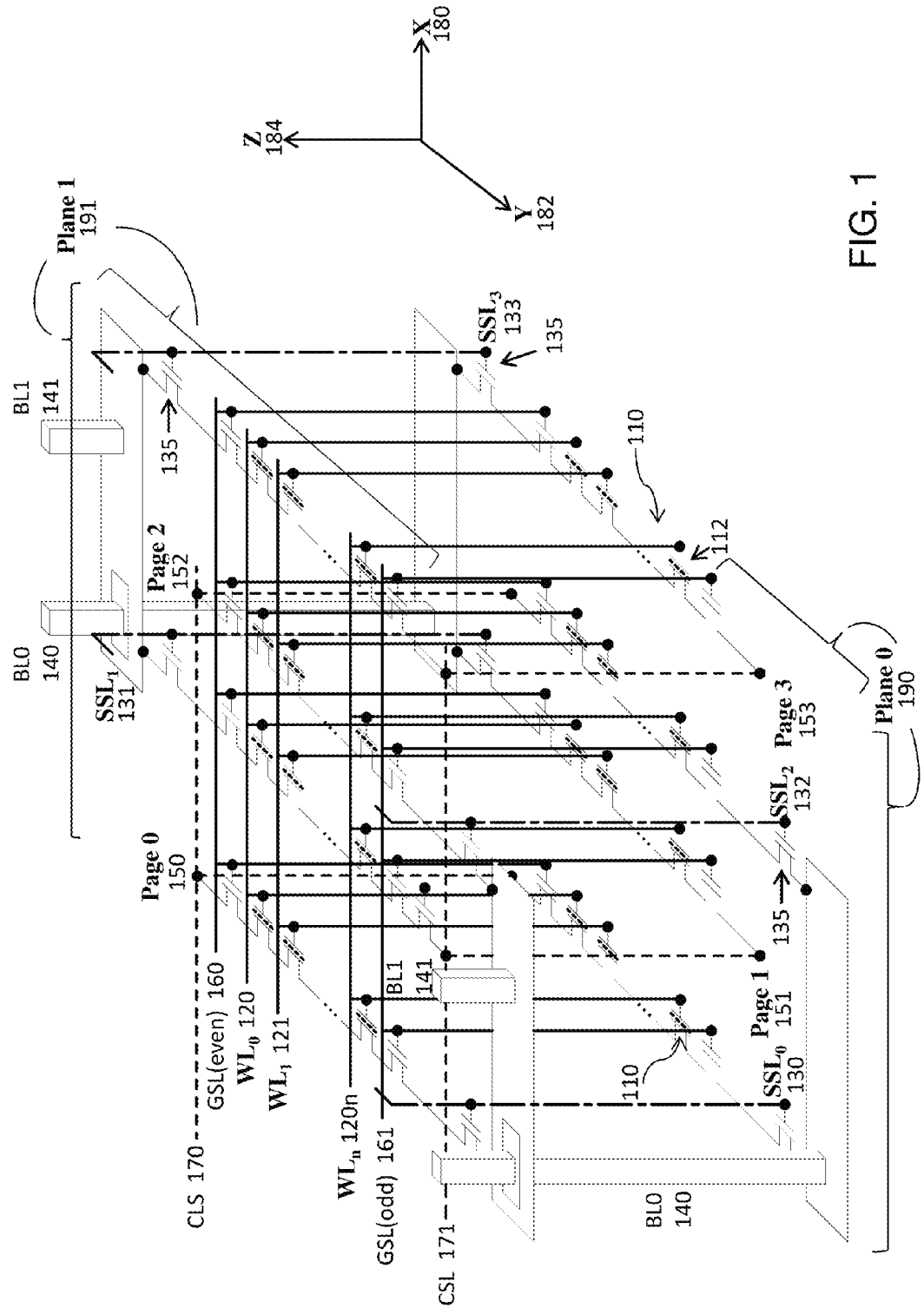
FIG. 1 shows a schematic view illustrating a 3D NAND Flash array.
Figure 2:
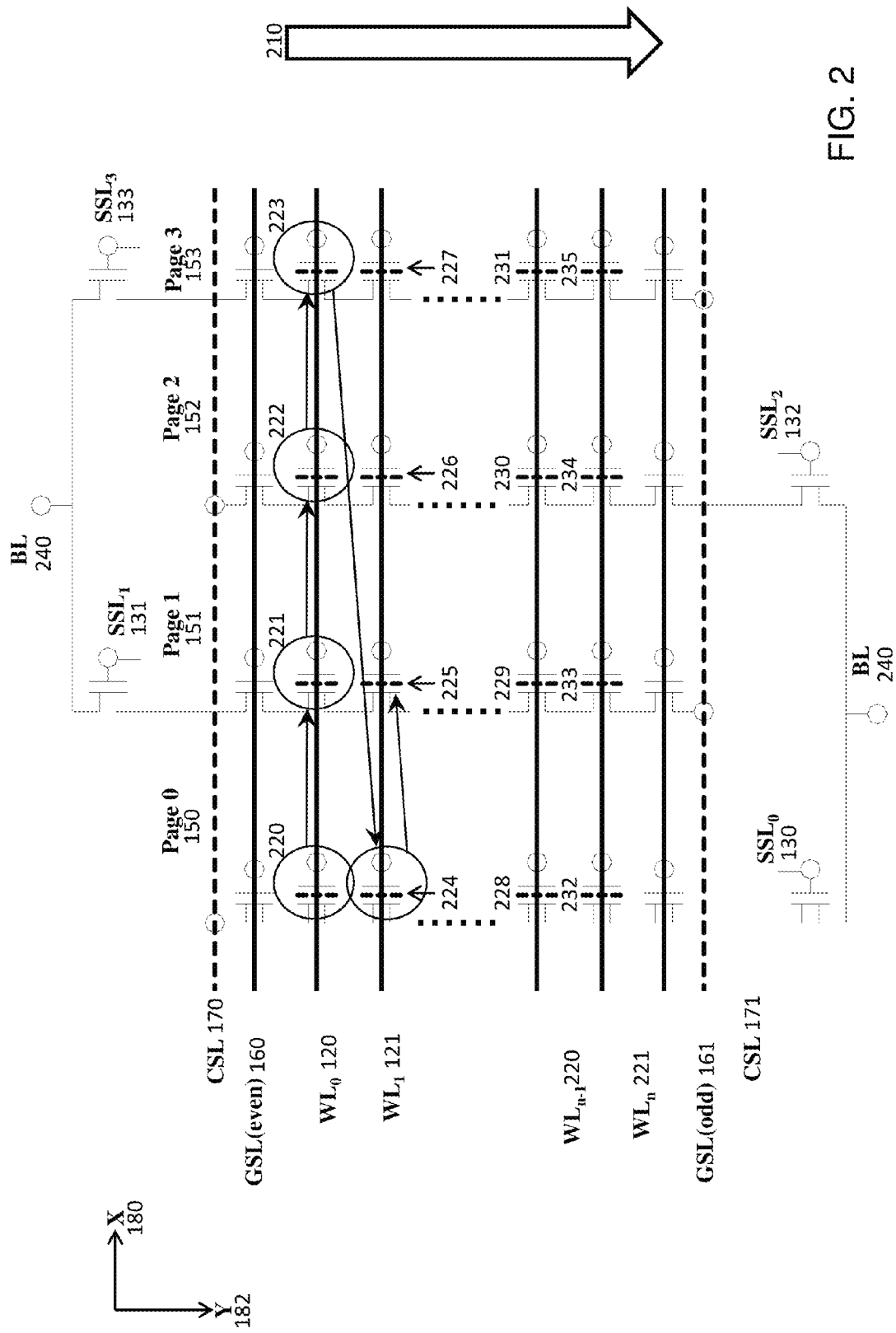
FIG. 2 shows a schematic view illustrating a "by-word-line" programming method applied to a plane of a 3D NAND Flash array.

FIG. 2 shows a schematic view illustrating a "by-word-line" programming method applied to a plane of a 3D NAND Flash Array. This plane may be part of a structure similar to that of FIG. 1. Accordingly, similar elements are marked with the same reference numbers, and the description of these elements will not be repeated.

The plane includes memory cells 220, 221, 222, and 223 which are all connected at their gates to the word line 120 ($WL_0$). Similarly, memory cells 224, 225, 226, and 227 are connected to the word line 121 ($WL_1$), memory cells 228, 229, 230, and 231 are connected to the word line 220 ($WL_{n-1}$), and memory cells 232, 233, 234, and 235 are connected to the word line 221 ($WL_n$). In the "by-word-line" method, the cells on each word line are programmed together in groups, and after all required programming on a given word line is completed, a subsequent word line is programmed. This process repeats until all word lines are iterated through. As indicated in the figure, the word line 120 may be programmed first.

The structure allows the memory cells 220, 221, 222, and 223 sharing the word line 120 to be programmed substantially simultaneously. However, it is often desirable to not change the state of some of the memory cell 220, 221, 222, and 223. Accordingly, various methods known in the art may be used to inhibit programming of any combination of the memory cells 220, 221, 222, and 223 that must be remain in their erased state (e.g., to represent a value of "1" in SLC NAND Flash or "11" in MLC NAND Flash). After the desired cells are programmed on the word line 120, the process continues on to the cells on the next word line 121, as indicated by the arrow 210. This process repeats until all n+1 word lines are accessed and programmed. In some embodiments, there are 64 word lines (n=63), and the cells on each word line are programmed starting with those on $WL_0$ and finishing with those on $WL_{63}$.

However, this programming method may have undesirable results. As even and odd pages alternate in orientation, the even pages 150 and 152 are actually programmed in a very different manner than are the odd pages 151 and 153. While the word line 120 is beneficially closest to the string select lines 131 and 133 of the odd pages 151 and 153, respectively, the word line 120 is also unsuitably closest to the common source line 170 of the even pages 150 and 152. This causes a back-pattern effect to occur in the even pages 150 and 152.

The back-pattern effect arises because the measured value of $V_t$ for a given cell is actually dependent on the states of all cells between the given cell and sense circuitry (not shown) connected to the bit line 240. During the programming stage, $V_t$ is set using measured feedback, under the assumption that the read conditions will be the same as those during the time of programming. If this assumption is false, the measured feedback and the resulting, programmed value of $V_t$ may not accurately represent the value of $V_t$ during a read operation that occurs after the remainder of the page has been fully programmed.

For example, the measured value of $V_t$ for the cell 220 is dependent on the state (e.g., the $V_t$) of the cells 224, 228, and 232, because these cells are between the cell 220 and the sense circuitry. Therefore, it would be beneficial to set $V_t$ for the cell 220 after each of the cells 224, 228, and 232 are each in a steady state. In other words, to avoid the uncertainty caused from having intervening programmed cells, it is desirable to defer programming cell 220 until after the cells 224, 228, and 232 are programmed. Further, if the cell 232 is reprogrammed, the cell 228 should ideally not be read until the cell 228 is also reprogrammed (or the NAND string having cells 228 and 238 is erased).

Accordingly, it would be beneficial for pages, as well as the NAND strings within pages, to be programmed by starting with the cells closest to the string select line and incrementally programming each cell in the page until the cell closest to the common source line is programmed. Accordingly, the methodology of FIG. 2 has some negative consequences for the cells on the even pages, especially those closest to the common source line. The resulting distribution of $V_t$ values can therefore be wider on even pages than on odd pages.

Figure 3:
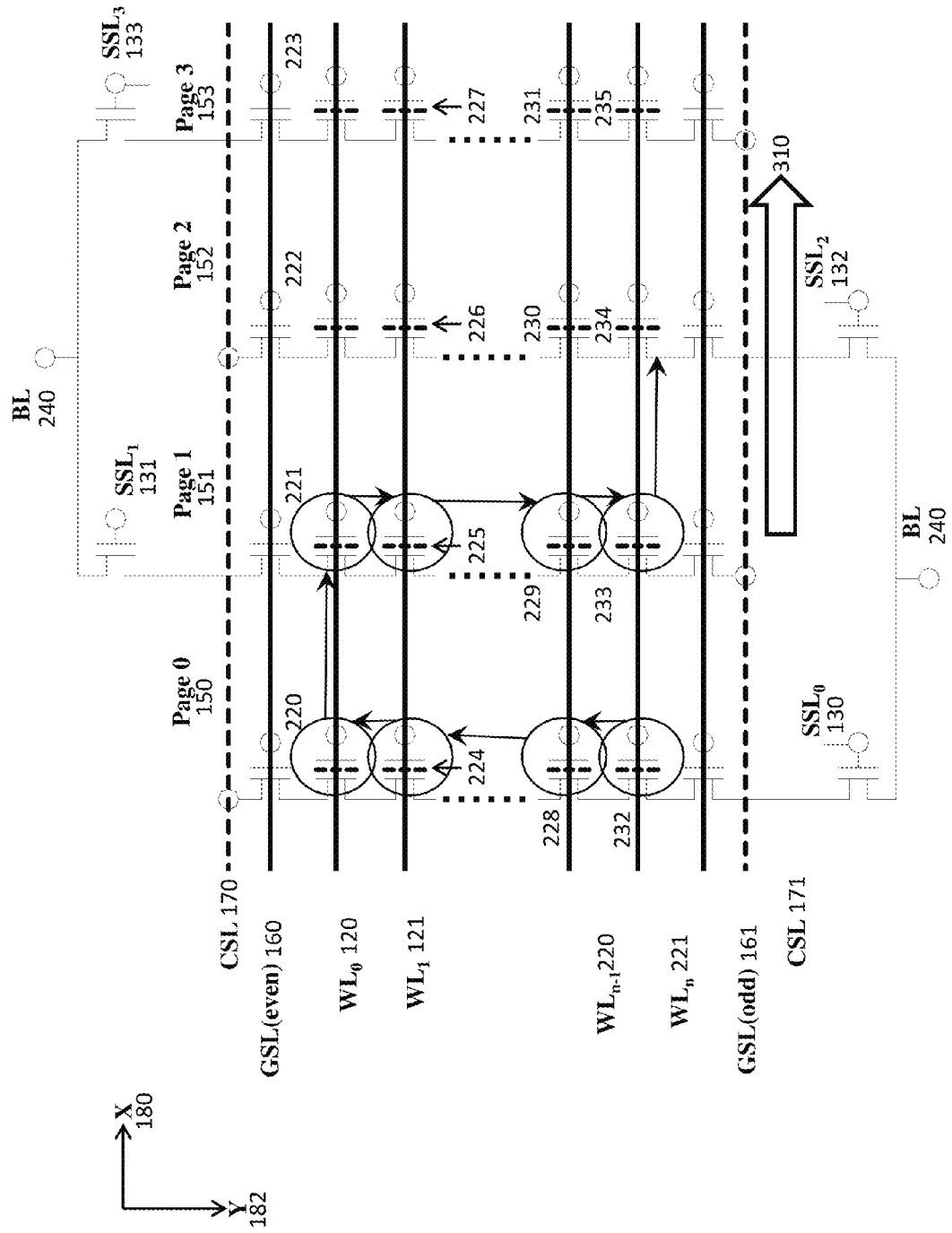
FIG. 3 shows a schematic view illustrating a "by-page" programming method applied to a plane of a 3D NAND Flash array.

FIG. 3 shows a schematic view illustrating a "by-page" programming method applied to a plane of a 3D NAND Flash array. This plane may be identical or similar to that of FIG. 2. Accordingly, similar elements are marked with the same reference numbers, and the description of these elements will not be repeated.

One intention of the "by-page" method is to overcome the back-pattern effect described above. A single page is programmed at a time, and each page is programmed starting with the cell or cells nearest to a string select line 130, 131, 132, 133 and finishing with the cell or cells nearest to a common source line 170, 171. For example, the first page may be programmed starting with the cell 232. As the cell 232 is closest to the bit line 240, as well as to the sense circuitry, it cannot be affected by the back-pattern effect. Once the $V_t$ of the cell 232 is set and in a steady state, the cell 228 may subsequently be programmed. Accordingly, as long as the cell 232 is not reprogrammed before the read operation on the cell 228, the cell 228 is not significantly affected by the back-pattern effect. The programming process continues on the page 150 until the cell 220 is programmed, which completes the programming of the page 150. The page 151 may be programmed next, though this is not a necessity for the "by-page" method. In the page 151, the cell 221 is the closest cell to the string select line 131, and it is the first cell to be programmed in the page 151. It can be noted that the cell 221 is addressed through the word line 120, whereas the first cell 232 to be programmed for the page 150 is addressed through a different word line 221. Again, this is related to the alternating orientations of adjacent pages, and it is a key problem when using the "by-word-line" method of FIG. 2. Referring back to FIG. 3, each of the other cells in the page 151 may subsequently be programmed, finishing with the cell 233. At this point, the programming operation for the page 151 may be finished, and the programming operation for another page, such as the page 152 or 153 may begin.

While the "by-page" method properly handles and minimizes the back-pattern effect in both even and odd pages, other negative side effects may occur. For example, because the cells 220, 221, 222, and 223 are each programmed during separate time periods, the effects of program disturb can be worsened. Program disturb can affect a given cell whenever any other cell within the same page (or NAND string) or sharing a word line is programmed. The phenomenon is caused by charge accumulation due to undesirably large voltage differentials between the channel and the gate of the disturbed cell, which can affect the disturbed cell's $V_t$.

For example, the cell 221 may be affected by program disturb whenever any other cell in the page 151 (e.g., the cells 225, 229, and 233) is programmed. This source of program disturb is roughly unchanged between the "by-word-line" and "by-page" methods. The cell 221 may also be affected by program disturb whenever the cells 220, 222, or 223 are programmed, because they all share the word line 120. As mentioned above, the cells 220, 222, and 223 are all programmed during different time intervals, unlike the "by-word-line" method. Accordingly, the amount of stress applied to the word line 120 and, in turn, to the cell 221 is greatly increased.

In general, cells may experience a larger than ideal amount of program disturb when programmed using "by-page" methods. This is especially true for cells that are programmed earlier in a programming cycle of a given block. Furthermore, as the number of pages in a block increases, the amount of program disturb induced by stress on word lines also increases. Accordingly, the "by-page" method can have poor scalability.

Figure 4:
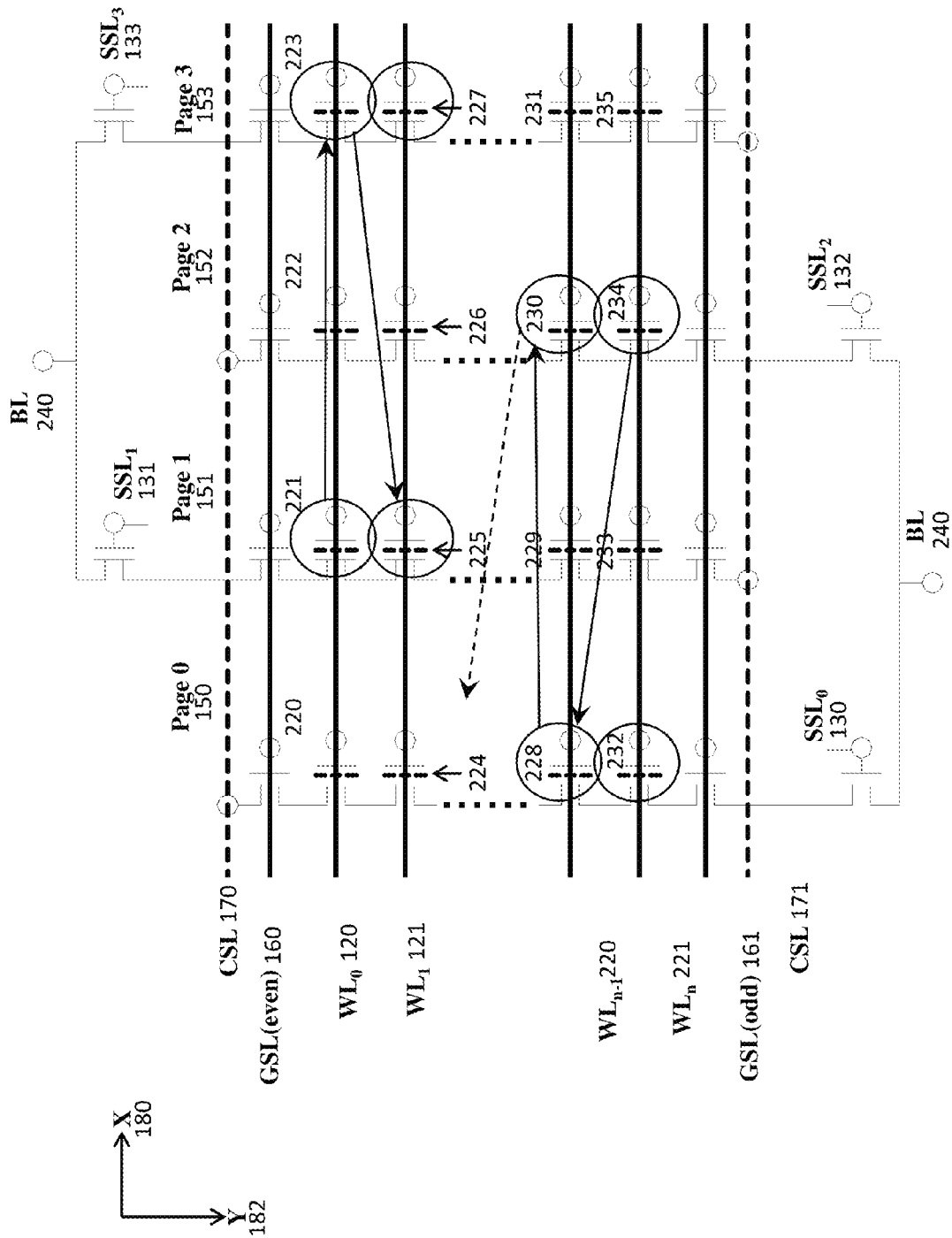
FIG. 4 shows a schematic view illustrating a hybrid programming method applied to a plane of a 3D NAND Flash array.

FIG. 4 shows a schematic view illustrating a hybrid programming method applied to a plane of a 3D NAND Flash array. This plane may be identical or similar to those of FIGS. 2 and 3. Accordingly, similar elements are marked with the same reference numbers, and the description of these elements will not be repeated.

The hybrid method combines aspects of both the "by-word-line" method and the "by-page" method, effectively limiting both the back-pattern effect as well as pattern-induced program disturb. In the hybrid method, the cells of multiple or all even pages in a block sharing a word line may be programmed simultaneously. Similarly, the cells of multiple or all odd pages in a block sharing a word line may also be programmed simultaneously. Accordingly, a given word line experiences stress (e.g., from a programming voltage) for a shorter total duration, and the stress on a given word line may be limited to only two time periods: one for programming cells on even pages and one for programming cells on odd pages.

The net effect is a reduction in pattern-induced program disturb, when compared with the "by-page" method. Furthermore, unlike the "by-word-line" method, each page is programmed starting with the cell closest to the string select line and finishing with the cell closest to the common source line. This effectively minimizes the back-pattern effect.

For instance, as shown in FIG. 4, the cells 232 and 234 lie on even pages and they are the closest cells in their respective pages 150 and 152 to the string select lines 130 and 132, respectively. Accordingly, the cells 232 and 234 may be programmed simultaneously to one another and they may be programmed before other cells on their pages to reduce the back-pattern effect. Because the cells 232 and 234 are programmed together, the overall stress on the word line 221 is reduced during the programming of the block. Accordingly, the pattern-induced program disturb on the cells 233 and 235 is reduced. After the cells 232 and 234 are programmed, the next set of even cells, which comprises the cells 228 and 230, may be programmed. This process may be repeated until a group of cells (or all cells) on the even pages in the block are programmed. Furthermore, during the programming of the even pages, programming may be inhibited on the odd pages.

A similar process may be applied to cells on odd pages. The cells 221 and 223 are the nearest cells on their respective pages 151 and 153 to the string select lines 131 and 133, respectively. Accordingly, these cells may be programmed before other cells on their pages to reduce the back-pattern effect. Furthermore, as the cells 221 and 223 are programmed together, the overall stress on the word line 120 is reduced, thereby reducing program disturb affecting the cells 220 and 222. After the cells 221 and 223 are programmed, the next set of odd cells, which comprises the cells 225 and 227, may be programmed. This process may be repeated until a group of cells (or all cells) on the odd pages in the block are programmed. Furthermore, during the programming of the odd pages, programming may be inhibited on the even pages.

It should be noted that the even pages 150 and 152 can be programmed flexibly with respect to the odd pages 151 and 153. In some embodiments, all even pages are programmed first, and all odd pages are programmed after the even pages. In some embodiments, all odd pages are programmed first, and all even pages are programmed after the odd pages. In some embodiments, a row of cells on the even pages is programmed, followed by a row of cells on the odd pages, and the process repeats until all cells are programmed as desired. For example, the even cells on the word line 221 may be programmed during a first time period, followed by the odd cells on the word line 120 during a second time period substantially immediately after the first time period. Subsequently, the even cells on the word line 220 may be programmed, followed by the odd cells on the word line 121. This alternating process may repeat until the even cells on the word line 120 are programmed and the odd cells on the word line 221 are programmed, thereby completing the programming operation on both the even pages 150 and 152 and the odd pages 151 and 153. In some embodiments, multiple rows of cells on even pages are programmed followed by multiple rows of cells on odd pages, and the process may repeat. Numerous other possibilities exist that embody the spirit of the present disclosure.

Figure 5:
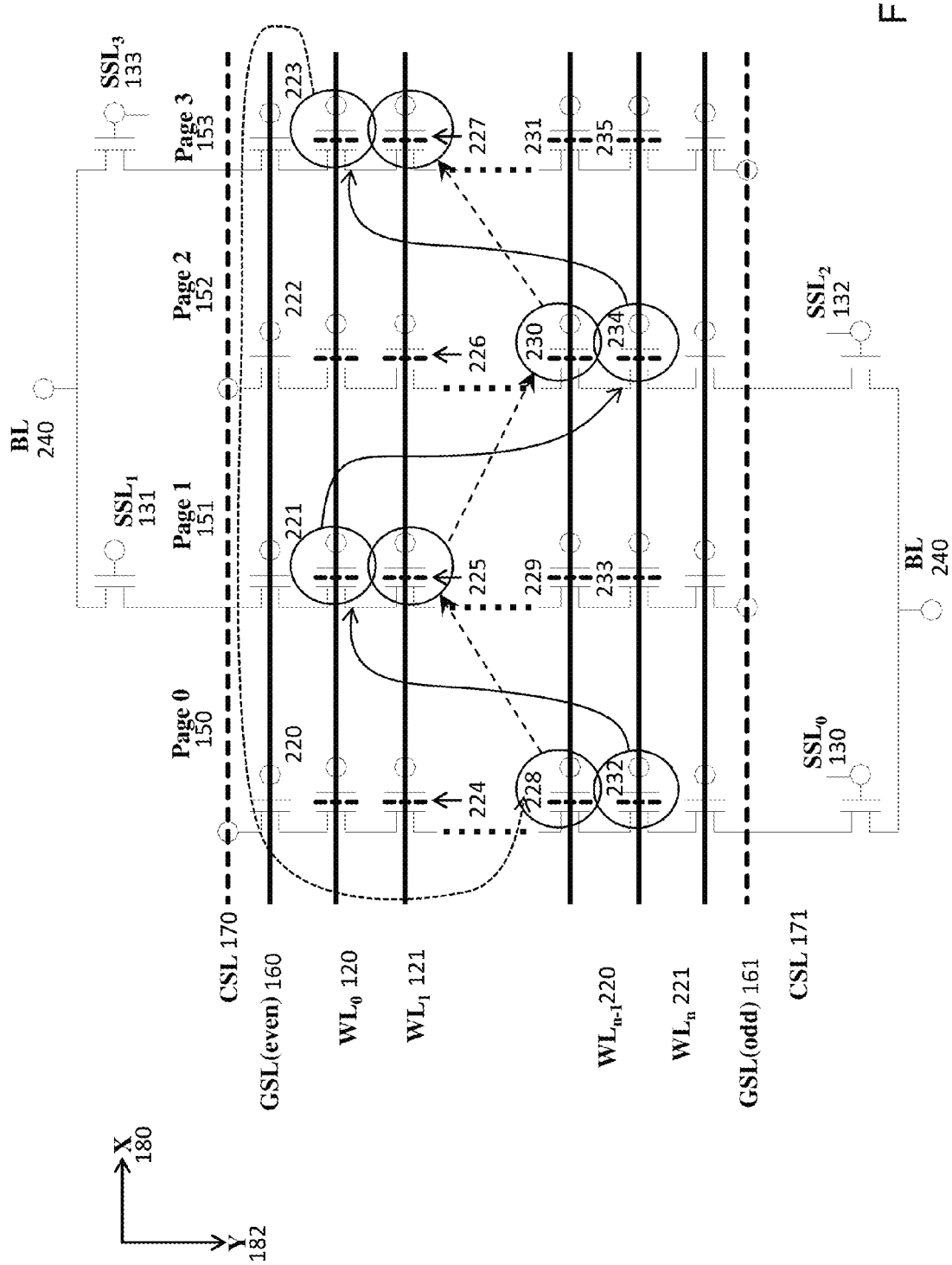
FIG. 5 shows a schematic view illustrating a hybrid programming method applied to a plane of a 3D NAND Flash array in an alternative embodiment.

FIG. 5 shows a schematic view illustrating a hybrid programming method applied to a plane of a 3D NAND Flash array in an alternative embodiment. This plane may be identical or similar to those of FIGS. 2-4. Accordingly, similar elements are marked with the same reference numbers, and the description of these elements will not be repeated.

In the embodiment shown in FIG. 5, each page is programmed starting with the cells closest to the string select line, and ending with the cells closest to the common source line, which is in accordance with the principles demonstrated in FIG. 4. However, in the embodiment shown in FIG. 5, the memory cells may be individually programmed. During the time when an individual memory cell is programmed, programming may be inhibited on other memory cells sharing a word line with the memory cell being programmed. This may involve inhibiting the programming of memory cells on pages having the same orientation (e.g., even or odd) as the memory cell being programmed. For example, the cells 232 and 234, which share the word line 221 and are both associated with even pages, may be programmed during separate time periods, such that cell 234 is inhibited when cell 232 is programmed and cell 232 is inhibited when cell 234 is programmed.

As shown in FIG. 5, the cell 232 is the nearest cell on the first page 150 to the string select line 130 and may be programmed first. The cell 221 is the nearest cell on the next page 151 to the string select line 131, and it may be programmed next. The programming process may continue with the cell 234 and then the cell 223, until the cells on each selected page nearest to their respective string select line are programmed. As the cells 228, 225, 230, and 227 are the next nearest cells on each selected page to their respective string select line, they may subsequently be programmed. This process may continue until the cells 220, 233, 222, and 235 are programmed, thereby completing the programming of the pages 150, 151, 152, and 153.

It should be noted that, in some embodiments, cells which are logically equidistant from their respective string select lines (e.g., the cells 232, 221, 234, and 223) may be programmed in different orders relative to one another. For example, the cells on the even pages (e.g., cells 232 and 234) may each be individually programmed before the cells on the odd pages (e.g., cells 221 and 223) are individually programmed.

The techniques demonstrated in FIG. 5 effectively reduce the back-pattern effect, as each page is programmed starting with the cells nearest to the string select line and ending with the cells nearest to the common source line. These techniques also alleviate pattern-induced program disturb, when compared with conventional programming techniques.

While FIGS. 1-5 show only two even pages and two odd pages, in some embodiments, the block may include additional even and odd pages. In these embodiments, all or a subset of cells on even pages within a row may be programmed simultaneously. Similarly, all or a subset of cells on odd pages within a row may be programmed simultaneously. In some embodiments, blocks may include a single even page and a single odd page.

It should be further noted that the memory cells may be implemented using any technologies known in the art. In some embodiments, the memory cells are single-level cells (SLC), which may each hold one bit of information. In other embodiments, the memory cells are multi-level cells (MLC), which may each hold more than one bit of information.

Figure 6:
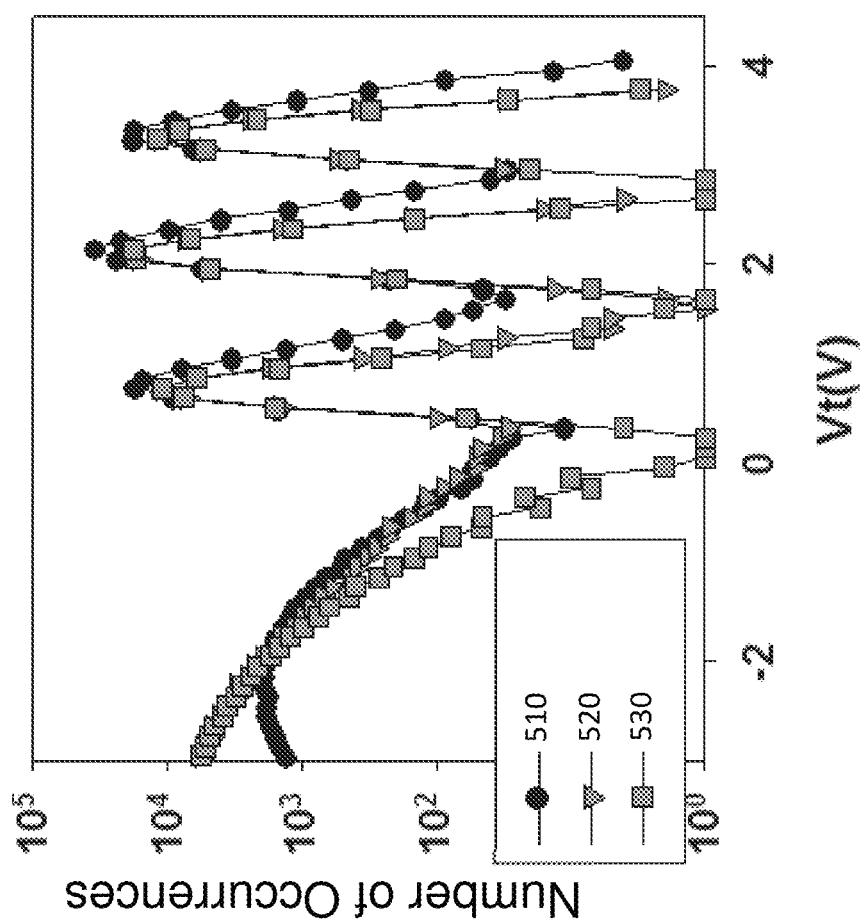
FIG. 6 shows a graph illustrating test results of various disclosed programming methods.

FIG. 6 shows a graph illustrating test results of the various programming methods disclosed herein. Specifically, the graph demonstrates sample $V_t$ distributions of blocks in MLC NAND Flash arrays after being programmed to store a predetermined set of information. The horizontal axis measures $V_t$ in volts and the vertical axis measures the number of occurrences within each $V_t$ value range on a logarithmic scale. A data set 510 represents the $V_t$ distribution of cells in a block programmed using the "by-word-line" programming method, as described in FIG. 2, a data set 520 represents the $V_t$ distribution of cells in a block programmed using the "by-page" programming method, as described in FIG. 3, and a data set 530 represents the $V_t$ distribution of cells in a block programmed using a hybrid programming method, as described in FIG. 4.

In the example provided, two bit are stored in each cell, which results in the four distinct $V_t$ peaks shown in the figure. From left to right, the peaks respectively represent digital values of "11," "10," "01," and "00." Ideally, the peaks of the $V_t$ distributions are as narrow as possible, and large margins are provided between adjacent peaks. This allows the sense circuitry used during read operations to more consistently and accurately discern the stored digital values.

The "by-word-line" method, represented by the data set 510, performs the most poorly, especially at the higher $V_t$ values associated with "10," "01," and "00." This is shown by the relatively high number of $V_t$ occurrences between the successive peaks. These in-between values may be misread by the sense circuitry, thereby requiring additional error correction code or even causing block failures. The "by-page" method, represented by the data set 520, performs relatively better in the range where $V_t > 1V$. However, the data set 520, shows a large number of occurrences occurring between the "11" peak and the "10" peak, which causes similar issues to those described above. However, the hybrid method, represented by the data set 530, provides for the highest margins, especially between the "11" and "10" peaks. This is at least in part due to the reduction of the back-pattern effect and pattern-induced program disturb, as described above.

The array may be implemented in an integrated circuit. The integrated circuit may also include a controller, which may be connected to the word lines, string select lines, bit lines, and other lines associated with the array. Through these connections and by utilizing sense circuitry, the controller may coordinate array operations including the read, write, and programming operations. The controller may be implemented as a general purpose processor, which executes a computer program to control the array operations. The computer program may be stored in non-transitory memory accessible by the processor. In other embodiments, the controller may be implemented through special purpose application circuitry, or a combination of modules providing system-on-a-chip functionality supported by the memory array, as is known in the art. In yet other embodiments, the controller may be implemented through a combination of special-purpose logic circuitry and a general-purpose processor. Further, the controller may implement or utilize a finite state machine to perform the array operations.

Various techniques may be used to inhibit programming of unselected cells sharing word lines with the selected cells during the programming operations. For example, a self boosting technique may be used, wherein the channels of unselected pages may be left floating. This can be accomplished by turning off both the string select transistor and the ground select transistor on each unselected page, causing the channels of these pages be disconnected from both the common source line and the remainder of the bit line. When a programming voltage is applied to a given word line to program cells on a selected page, the channels of the unselected pages may be boosted through capacitive coupling, thereby inhibiting programming of the unselected cells. In some embodiments, the channel voltage of the unselected pages may be directly raised by the bit line, which can similarly inhibit programming on these pages. Numerous other techniques known in the art may be used either alone or in combination to inhibit programming on unselected pages.

In the context of this disclosure, the term "programming" refers generally to accessing or iterating through a selected cell or cells during a write operation. However, the $V_t$ value or values of the selected cell or cells may not necessarily change as a result of the write operation.

It is to be understood that the principles described herein can be applied outside the context of NAND Flash memory devices described in the exemplary embodiments, including NOR Flash memory devices, one-time programmable (OTP) memory devices, other anti-fuse-based memory devices, floating gate memory devices, charge trapping memory devices, nonvolatile memory devices, embedded memory devices, and/or other memory devices.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Various terms used in the present disclosure have special meanings within the present technical field. Whether a particular term should be construed as such a "term of art" depends on the context in which that term is used. "Connected to," "in communication with," "associated with," or other similar terms should generally be construed broadly to include situations both where communications and connections are direct between referenced elements or through one or more intermediaries between the referenced elements. These and other terms are to be construed in light of the context in which they are used in the present disclosure and as one of ordinary skill in the art would understand those terms in the disclosed context. The above definitions are not exclusive of other meanings that might be imparted to those terms based on the disclosed context.

Words of comparison, measurement, and timing such as "at the time," "equivalent," "during," "complete," and the like should be understood to mean "substantially at the time," "substantially equivalent," "substantially during," "substantially complete," etc., where "substantially" means that such comparisons, measurements, and timings are practicable to accomplish the implicitly or expressly stated desired result.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A memory device, comprising:
    an array structure of memory cells, the array structure organized into a plurality of even pages, a plurality of odd pages, and a plurality of rows that are perpendicular to the even and odd pages, such that each row includes a first plurality of memory cells located on the even pages and a second plurality of memory cells located on the odd pages;
    a first string select structure at a first side of the array structure and connected to the even pages;
    a second string select structure at a second side of the array structure opposite the first side, the second string select structure connected to the odd pages; and
    a controller operably connected to the array structure and to the first and second string select structures,
    wherein the controller is operable to program the even pages, beginning with the first plurality of memory cells in a first row closest to the first side,
    wherein the controller is further operable to program the odd pages, beginning with the second plurality of memory cells in a last row farthest from the first side,
    wherein all of the memory cells in the first plurality of memory cells in the first row are programmed substantially simultaneously during a first time period,
    wherein all of the memory cells in the second plurality of memory cells in the last row are programmed substantially simultaneously during a second time period; and
    wherein the second time period is substantially immediately after the first time period, and the first and second pluralities of memory cells are alternately programmed.

2. The memory device of claim 1, wherein the controller is further operable to program the first plurality of memory cells that are associated with even pages in every row before the controller begins programming the odd pages.

3. The memory device of claim 1, wherein the controller is further operable to program the second plurality of memory cells that are associated with odd pages in every row before the controller begins programming the even pages.

4. The memory device of claim 1, wherein each memory cell in the first plurality of memory cells is individually programmed, such that when a memory cell within the first plurality of memory cells is programmed, programming is inhibited for a remainder of memory cells within the first plurality of memory cells.

5. The memory device of claim 1, wherein all of the memory cells in the first plurality of memory cells in the first row are programmed substantially simultaneously during a first time period.

6. The memory device of claim 5, wherein programming is inhibited on the odd pages during the first time period.

7. The memory device of claim 1, wherein the array structure is a 3D NAND Flash array structure.

8. The memory device of claim 1, wherein the memory cells are multi-level cells that each store more than one bit of information.

9. A method for programming memory cells in an array structure, the array structure organized into a plurality of even pages, a plurality of odd pages, and a plurality of rows that are perpendicular to the even and odd pages, such that each row includes a first plurality of memory cells located on the even pages and a second plurality of memory cells located on the odd pages, the method comprising:
    selecting the even pages with a first string select structure provided at a first side of the array structure and connected to the even pages, the first string select structure being closest to a first row;
    programming, by a controller, the even pages, beginning with the first plurality of memory cells in the first row;
    selecting the odd pages with a second string select structure provided at a second side of the array structure and connected to the odd pages, the second string select structure being closest to a last row; and
    programming, by the controller, the odd pages, beginning with the second plurality of memory cells in the last row;
    wherein the programming occurs substantially simultaneously for all of the memory cells in the first plurality of memory cells in the first row during a first time period;
    wherein the programming occurs substantially simultaneously for all of the memory cells in the second plurality of memory cells in the last row during a second time period; and
    wherein the second time period is substantially immediately after the first time period, and the first and second pluralities of memory cells are alternately programmed.

10. The method of claim 9, wherein the first pluralities of memory cells in every row are programmed before the programming of the odd pages.

11. The method of claim 9, wherein the second pluralities of memory cells in every row are programmed before the programming of the even pages.

12. The method of claim 9, wherein each memory cell in the first plurality of memory cells is individually programmed, such that when a memory cell within the first plurality of memory cells is programmed, programming is inhibited for a remainder of memory cells within the first plurality of memory cells.

13. The method of claim 9, wherein the programming occurs substantially simultaneously for all of the memory cells in the first plurality of memory cells in the first row during a first time period.

14. The method of claim 13, wherein programming is inhibited on the odd pages during the first time period.

15. The method of claim 9, wherein the array structure is a 3D NAND Flash array structure.

16. The method of claim 9, wherein the memory cells are multi-level cells that each store more than one bit of information.

* * * * *